US012658911B2

(12) United States Patent
Boudoux et al.

(10) Patent No.: US 12,658,911 B2
(45) Date of Patent: Jun. 16, 2026

(54) ELECTRICAL POWER SWITCHING CIRCUIT

(71) Applicant: Aptiv Technologies AG, Schaffhausen (CH)

(72) Inventors: Emmanuel Boudoux, Cologne (DE); Thorsten Rosenthal, Mülheim an der Ruhr (DE); Benjamin Zass, Wuppertal (DE)

(73) Assignee: Aptiv Technologies AG, Schaffhausen (CH)

( * ) Notice: Subject to any disclaimer, the term of this patent is extended or adjusted under 35 U.S.C. 154(b) by 186 days.

(21) Appl. No.: 18/419,643

(22) Filed: Jan. 23, 2024

(65) Prior Publication Data

US 2024/0250680 A1      Jul. 25, 2024

(30) Foreign Application Priority Data

Jan. 24, 2023      (EP) ..................................... 23153112

(51) Int. Cl.
*H03K 17/08*          (2006.01)
*H03K 17/082*         (2006.01)

(52) U.S. Cl.
CPC ................................. *H03K 17/0822* (2013.01)

(58) Field of Classification Search
CPC ................................................ H03K 17/0822
See application file for complete search history.

(56) References Cited

U.S. PATENT DOCUMENTS

| | | | | |
|---|---|---|---|---|
| 4,736,267 A * | 4/1988 | Karlmann | .............. | H02H 3/087 |
| | | | | 361/93.7 |
| 11,211,928 B1 | 12/2021 | Valero | | |
| 2014/0049866 A1* | 2/2014 | Reiter | ................... | H03K 17/18 |
| | | | | 361/86 |

(Continued)

FOREIGN PATENT DOCUMENTS

| | | |
|---|---|---|
| DE | 10245293 A1 | 4/2004 |
| WO | 2017175326 A1 | 10/2017 |

OTHER PUBLICATIONS

Extended European Search Report for EP23153112, 9 pages, Jul. 11, 2023.

(Continued)

*Primary Examiner* — Scott Bauer
(74) *Attorney, Agent, or Firm* — Miller Johnson

(57)          ABSTRACT

Disclosed is an electrical power switching circuit. The electrical power switch circuit includes a first semiconductor switch having a first control input and a second semiconductor switch having a second control input. The first semiconductor switch and the second semiconductor switch are connected in series. The electrical power switch circuit includes a comparator configured to compare a first voltage to a second voltage and to output a first electrical signal if the first voltage exceeds the second voltage by a first predetermined threshold and to output a second electrical signal if the second voltage exceeds the first voltage by a second predetermined threshold. The electrical power switch circuit includes a combiner configured to combine the first signal and the second signal and to feed a combined signal to the first and second control inputs of the first and second semiconductor switches.

13 Claims, 3 Drawing Sheets

(56) References Cited

U.S. PATENT DOCUMENTS

2020/0194769 A1\*  6/2020  Conner ............... H01M 50/579

OTHER PUBLICATIONS

Grego et al., "Control of the switching transients of IGBT series strings by high-performance drive units" IEEE transactions on industrial electronics, pp. 197-203, Dec. 3, 1999.

Liu et al., "A Comprehensive Short-Circuit Protection Scheme for Series-Connected SiC MOSFETs," IEEE Open Journal of Power Electronics, vol. 3, Dec. 18, 2021.

Qui Tu Vo et al., "Short-circuit Protection for the Series-Connected Switches in High Voltage Applications," Journal of Power Electronics, vol. 16, No. 4, pp. 1298-1305 , Jul. 2016.

\* cited by examiner

1

ELECTRICAL POWER SWITCHING CIRCUIT

CROSS-REFERENCE TO RELATED APPLICATIONS

This application claims priority to EP 23 153 112 filed Jan. 24, 2023, the entire disclosure of which is incorporated by reference.

FIELD

The present invention generally relates to an electrical power switching circuit, in particular for automotive applications.

BACKGROUND

Semiconductors are widely used for power switching applications such as currentless controllable switches, inverters, switched-mode power supplies, DC/DC-converters and motor control units. A prominent example is a metal-oxide-semiconductor field-effect transistor (MOSFET) also called power MOSFET. It comprises an insulated gate and an input and an output called drain and source, respectively. The voltage or potential at the gate controls the conductivity between drain and source.

Semiconductors used in power switching applications may become deteriorated in a way that makes them uncontrollable and may lead to overheating and even fire. As an example, rapid oxidation in power MOSFETs may lead to a short-circuit between gate and drain. When current is flowing out of the output (source), the voltage across the MOSFET may become significant resulting in a power dissipation that quickly reaches tens of Watts. Such power dissipation may cause the device to overheat and even catch fire. Even if such detrimental power dissipation could be detected, the MOSFET could not be switched off due to the short-circuit between gate and drain. The device is in an uncontrollable and hazardous state.

To avoid further damages, so called PCB fuses are sometime used. These are special conductor paths on printed circuit boards (PCB) arranged to melt in case of overcurrent. When melting, such fuses produce high temperatures and may even cause fire. In addition, PCB fuses are difficult to manage in case of updates or revisions to the PCB board or the components placed thereon. Therefore, designing an electrical power switching circuit that avoids the mentioned problems is a challenging task.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present invention provides an electrical power switching circuit comprising: a first semiconductor switch (Q1) having a first control input and a second semiconductor switch (Q2) having a second control input, wherein the first semiconductor switch (Q1) and the second semiconductor switch (Q2) are connected in series; a comparator configured to compare a first voltage to a second voltage and to output a first electrical signal if the first voltage exceeds the second voltage by a first predetermined threshold and to output a second electrical signal if the second voltage exceeds the first voltage by a second predetermined threshold, wherein the first voltage corresponds to a voltage drop across the first semiconductor switch (Q1) and the second voltage corresponds to a voltage drop across the second semiconductor switch (Q2); and a combiner configured to combine the first signal and the second signal and to feed a combined signal to the first and second control inputs of the first and second semiconductor switches.

By arranging two semiconductor switches in series, the switch that is not damaged can interrupt the current flowing through the damaged switch. The probability of both switches being damaged is very low. As the current flowing through the damaged switch is interrupted, the risk of overheating and fire is significantly reduced. A damaged semiconductor switch is detected by monitoring and comparing the voltage drops across both switches. As long as both switches are properly working, both voltage drops are expected to be similar. A damaged semiconductor switch usually shows a higher voltage drop than an undamaged switch. Hence, as soon as one voltage drops starts rising above the other voltage drop, this might signal a damage to one of both switches. The comparator outputs electrical signals if one of both voltage drops exceeds the other voltage drop by a predetermined threshold. The electrical signals are combined into a combined signal which indicates a failure of one of both switches. This combined signal is fed to the control inputs of the semiconductor switches to shut down switches. Even if the damaged switch would not react to such a signal, e.g. due to a short-circuit between gate and drain in case of MOSFETs, the other, undamaged switch would still be turned off and would stop current from flowing through the damaged switch.

The semiconductor switches may be MOSFETs. On the one hand, MOSFETs advantageously allow to control high currents with a very small switching current at fast switching times. On the other hand, and as outlined above, MOSFETs may suffer from rapid oxidation or may otherwise be damaged. The subsequent overcurrent may cause overheating and even fire. Thus, the present invention is particularly effective when using MOSFETs.

The combined signal may be configured to control the operation of the first and/or second semiconductor switch. In this way, at least the undamaged semiconductor switch may be turned off by the combined control signal in case of an unusual difference of the voltage drops to avoid further damages and to reduce the risk of fire.

The first threshold and the second threshold may be the same. This may for example be the case when using similar semiconductor switches with similar characteristics, e.g. the same type of switch, and may simplify the circuit design.

The electrical power switching circuit may additionally comprise a first differential amplifier configured to measure the voltage drop across the first semiconductor switch and to output an amplified voltage to the comparator; and a second differential amplifier configured to measure the voltage drop across the second semiconductor switch and to output an amplified voltage to the comparator. In this way, even small voltage drops across the semiconductor switches may be detected and a fault in one of the semiconductor switches may be detected well in advance of overheating. Further damages may then be avoided by switching off the undamaged switch.

The electrical power switching circuit may be configured such that the combined signal switches off at least one of the first semiconductor switch and the second semiconductor switch. As outlined above, this avoids further damages to the faulty switch and substantially reduces the risk of overheating and fire.

The electrical power switching circuit may further comprise a latch configured to latch the first signal and the second signal. The content of the latch may be read out for diagnostic purposes, for example to determine which of the switches caused the circuit to shut down. The latched signal may also act as a block and inhibit the control inputs of the switches to avoid switching on the circuit again. The latch may be reset only upon inspection and maintenance of the circuit.

The latch may be configured to provide the latched first signal and the latched second signal to the combiner. Thus, the combiner permanently provides the combined signal to the control inputs of the switches and inhibits switching on the circuit again. Only if the latch is reset, the combined signal may clear the control inputs and normal operation of the circuit may be resumed, e.g. after inspection and maintenance.

The combiner may be a logical gate. In this way, both first and second signals may be combined to a single signal and if only one of the switches causes an abnormal voltage drop, the entire circuit may be shut down. The combiner may be an OR gate.

The electrical power switching circuit may further comprise a delay module configured to delay the first signal and the second signal. Thus, the first and second signals need to have certain duration before causing the circuit to shut down. In this way, false alerts caused by glitches or load variations may be avoided and the operational stability of the circuit is improved.

The delay module may comprise an RC-circuit. This allows for a cost-effective implementation of the delay module. The time constant of the delay module may be adjusted by choosing appropriate resistance and capacitance values.

The first signal may indicate a failure of the first semiconductor switch and the second signal may indicate a failure of the second semiconductor switch. As outlined above, in conjunction with the combiner, occurrence of only one of the first and second signal is sufficient to cause a shutdown of the entire circuit and to avoid further damages. Furthermore, using a latch, occurrence of the first or second signal may be stored to avoid switching on the circuit again and for diagnostic purposes.

The electrical power switching circuit may further comprise at least one output indicating a failure of the first semiconductor switch and/or second semiconductor switch for diagnostic purpose. For example, the output may be provided to a control unit which is adapted to take further action in case of a failure of the circuit or the failure may be logged. For example, if the circuit is used in an automotive application, the failure may be indicated to a driver and additionally be logged for maintenance purposes.

The electrical power switching circuit may further comprise a common input configured to simultaneously switch the first semiconductor switch and the second semiconductor switch. Thus, the common input may be used to switch both switches on and off simultaneously. The circuit may be used for switching high currents with the added benefit of fault detection of its internal power components and subsequent automatic shutdown to avoid further damages, overheating and even fire.

The electrical power switching circuit may be configured to switch electrical power for an automotive application.

Switching high currents is a frequent task in vehicles and overheating or even fire due to faulty components is to be avoided.

Another aspect of the present invention relates to a system comprising an electrical power switching circuit as described herein and a load connected to the electrical power switching circuit such that the electrical power switching circuit is configured to control the operation of the load. The load may be a motor, an actuator, a magnetic valve, a lamp, a light emitting diode (LED), a rechargeable battery, or an electrical control unit. Generally, the system may be implemented in a vehicle.

The present invention also relates to a method of controlling electrical current. The method comprises the steps of measuring a first voltage drop across a first semiconductor switch; measuring a second voltage drop across a second semiconductor switch being connected in series with the first semiconductor switch; comparing the first voltage drop to the second voltage drop; and switching off at least one of the first semiconductor switch and the second semiconductor switch if the first voltage drop exceeds the second voltage drop by a first predetermined threshold or if the second voltage drop exceeds the first voltage drop by a second predetermined threshold.

By arranging two semiconductor switches in series, the switch that is not damaged can interrupt the current flowing through the damaged switch. The probability of both switches being damaged is very low. As the current flowing through the damaged switch is interrupted, the risk of overheating and fire is significantly reduced. A damaged semiconductor switch is detected by monitoring and comparing the voltage drops across both switches. As long as both switches are properly working, both voltage drops are expected to be similar. A damaged semiconductor switch usually shows a higher voltage drop than an undamaged switch. Hence, as soon as one voltage drops starts rising above the other voltage drop, this might signal a damage to one of both switches.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

Possible embodiments of the invention are described in more detail in the following detailed description with reference to the following figures.

In the drawings, reference numbers may be reused to identify similar and/or identical elements.

DETAILED DESCRIPTION

For the sake of brevity, only a few embodiments will be described below. The person skilled in the art will recognize that the features described with reference to these specific embodiments may be modified and combined in different ways and that individual features may also be omitted. The general explanations in the sections above also apply to the more detailed explanations below.

Figure 1:
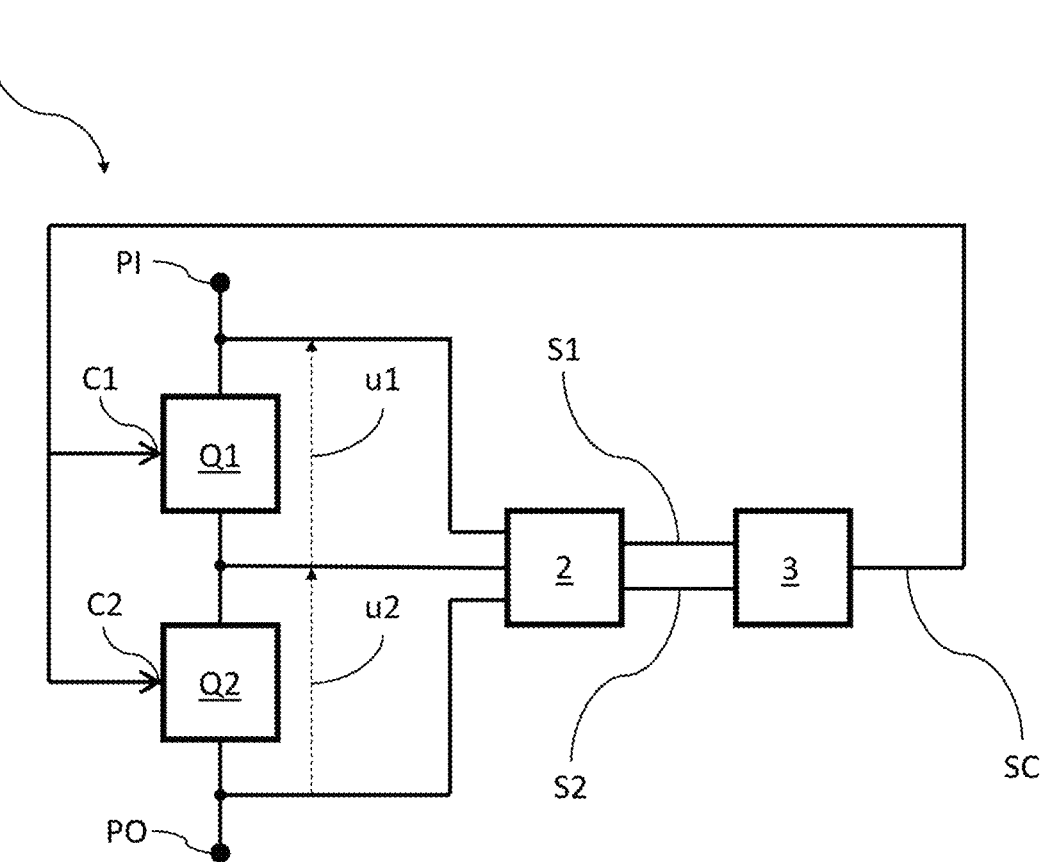
FIG. 1 illustrates the general principle underlying a power switching circuit according to the present invention.

FIG. 1 illustrates the general principle underlying a power switching circuit 1 according to the present invention. The circuit comprises a first semiconductor switch Q1 and a second semiconductor switch Q2. Both switches may for example be power MOSFETs and may comprise drivers (e.g. high-side drivers) if needed. The semiconductor switches Q1 and Q2 are connected in series. The power switching circuit 1 comprises a power input PI and a power output PO. Voltage is applied to the power input PI and a load (not shown in FIG. 1) is connected to the power output PO. Power (electrical voltage and current) to the load is switched by using the semiconductor switches Q1 and Q2. If both switches are in an "off" state, no (or at most an insignificant quiescent current) flows from the power input PI through the switches Q1 and Q2 to the power output PO. If both switches are in an "on" state operational current flows from the power input PI through the switches Q1 and Q2 to the power output PO supplying the load with power (electrical voltage and current).

In order to switch the semiconductor switches Q1 and Q2 between an "off" and "on" state, both switches comprise control inputs C1 and C2, respectively. Those inputs allow controlling the state of the switches by using low currents compared to the currents flowing through the switches in the "on" state. To simultaneously control both switches, the power switching circuit 1 may comprise a common input (not shown) connected to both control inputs C1 and C2 of the semiconductor switches Q1 and Q2. Thus, a single input may be used to switch the entire circuit 1 on or off and to control the supply of power to a load connected to the power output PO.

The power switching circuit 1 also comprises a comparator 2 which is configured to compare a first voltage to a second voltage. In the circuit 1 according to the invention the comparator 2 is configured to compare a first voltage drop u1 across the first semiconductor switch Q1 against a second voltage drop u2 across the second semiconductor switch Q2. The comparator 2 may be implemented by operational amplifiers and/or off-the-shelf components being specifically targeted to comparator applications.

The comparator 2 is also configured to output a first electrical signal S1 if the first voltage u1 exceeds the second voltage u2 by a first predetermined threshold and to output a second electrical signal S2 if the second voltage u2 exceeds the first voltage u1 by a second predetermined threshold. Both thresholds may be equal. The comparator 2 may have corresponding inputs for setting the threshold, e.g. by corresponding control voltages. The signals S1 and S2 may for example be realized by a change in voltage at the outputs of the comparator. For example, presence of the first and second signals S1 and S2 may correspond to a voltage swing from ground to positive supply voltage or vice versa. Other voltage levels are possible, for example those defined in transistor-transistor logic (TTL) or complementary metal-oxide-semiconductor (CMSO) logic.

The first and second signals S1 and S2 are fed to a combiner 3 which is configured to combine the first signal S1 and the second signal S2. The combiner may for example be a logical OR gate which provides a logical OR function to its inputs. Thus, presence of at least one of the first signal S1 and the second signal S2 causes the combiner 3 to output a combined signal SC. The combined signal SC of the combiner 3 is fed to the control inputs C1 and C2 of the semiconductor switches Q1 and Q2, respectively. The combined signal SC causes at least one of the semiconductor switches Q1 and Q2 to be switched off.

The combined signal SC may be combined with the common input of the circuit 1 for example by using an AND gate such that in normal operation the circuit may be switched on and off by the common input but that in an abnormal condition indicated by a difference in the voltage drops u1 and u2 the combined signal SC overrides the common input and switches off the entire circuit regardless of the state of the common input.

The power switching circuit 1 avoids overheating or even fire in case one of the semiconductor switches Q1 and Q2 is damages, e.g. by rapid oxidation which may occur with MOSFETs. A malfunction of a semiconductor switch is usually indicated by a rise in voltage drop across its power input and power output (e.g. source and drain in case of MOSFETs). Thus, by comparing the voltage drop u1 against the voltage drop u2 while both switches are in the "on" state, a malfunction of one of the switches is detected well in advance of overheating of the damages switch or even fire. In the example circuit 1, the comparator outputs a signal S1 if the first voltage drop u1 exceeds the second voltage drop u2. This would signal a malfunction of the first switch Q1. The comparator outputs a signal S2 if the second voltage drop u2 exceeds the first voltage drop u1. This would signal a malfunction of the second switch Q2. To allow for component tolerances, the difference in voltage drops is to exceed corresponding thresholds which may be calibrated when manufacturing the circuit or when mounted.

The combiner 3 outputs a combined signal SC if one of the signals S1 or S2 (or both) occurs. The combined signal is fed back to the control inputs of the semiconductor switches Q1 and Q2 and causes at least the undamaged switch to shut down. Even if the damaged switch does not react to signals on its control input (e.g. due to a short-circuit between drain and gate in case of MOSFETs), the undamaged switch would react and stop current from flowing through the damaged switch. In this way, overheating of the damaged switch is avoided.

Figure 2:
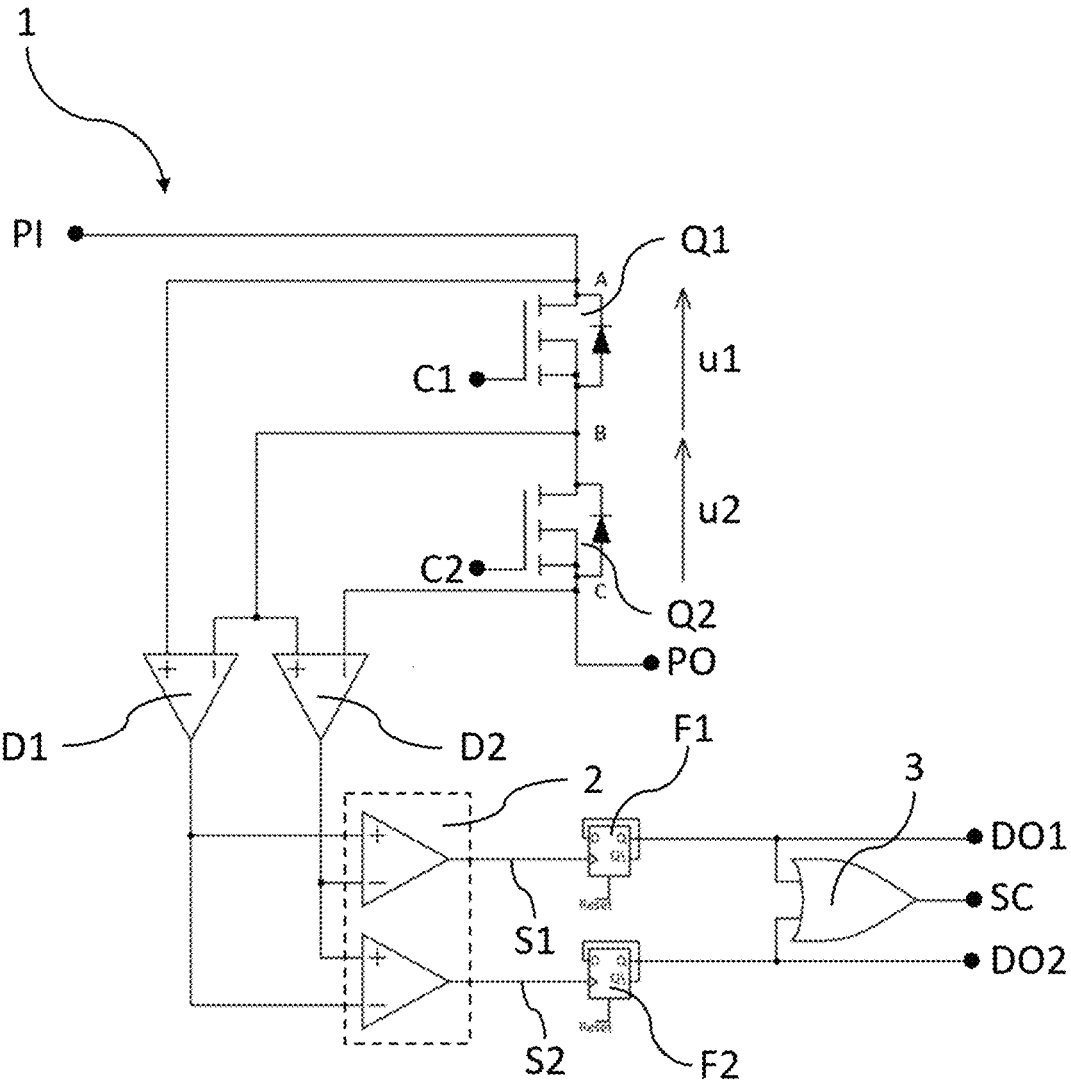
FIG. 2 shows an example embodiment of a power switching circuit according the present invention.

FIG. 2 shows an example embodiment of a power switching circuit according to the present invention. The circuit 1 comprises a first Q1 and second Q2 MOSFET connected in series. The voltage drop u1 across the first MOSFET Q1 between points A and B is amplified by a first differential amplifier D1. The voltage drop u2 across the second MOSFET Q2 between points B and C is amplified by a second differential amplifier D2. The differential amplifiers D1 and D2 ensure that even small voltage drops and variations among them can be detected. The amplified voltage drops are fed to a comparator 2. The comparator outputs a first signal S1 on a first output if the first amplified voltage drop u1 exceeds a first threshold and outputs a second signal S2 on a second output if the second amplified voltage drop u2 exceeds a second threshold. The first and second signals S1 and S2 are fed to latches F1 and F2, respectively, i.e. the corresponding outputs of the comparator 2 are connected to corresponding inputs of the latches F1 and F2.

In the example embodiment of FIG. 2 the latches F1 and F2 are realized as D flip-flops with the inverting output Q\ fed back to the D input and the outputs of the comparator 2 connected to the clock inputs of the flip-flops F1 and F2. Assuming the Q outputs of the flip-flops are initially "low" (Q\ "high"), a rising edge caused by the first or second signal S1 or S2, respectively, will cause the output Q of the flip-flops to take the state at the input D which is "high". Thus, an exceeding of the thresholds at the comparator 2 will be latched in the D flip-flops and stored. The outputs Q of the flip-flops F1 and F2, respectively, are connected to diagnostic outputs DO1 and DO1 of the power switching circuit 1.

Thus, if the output DO1 is "high", this indicates a failure of the first switch Q1 and if the output DO2 is "high", this indicates a failure of the second switch Q2. In this way, any malfunction or default is latched even if the power to the malfunctioning switch is interrupted by the undamaged switched as outlined with respect to FIG. 1. The flip-flops F1 and F2 also comprise reset inputs which allow to reset the respective output of the flip-flops. This may be used to check whether the error would reappear if the power switching circuit 1 would be switched on again.

For completeness, it is noted that the D outputs of the flip-flops F1 and F2, respectively, are fed to a combiner 3 which in this example embodiment is an OR gate. Thus, if one of the first S1 or second S2 signal appears at the outputs of the comparator 2, the OR gate 3 outputs a corresponding combined signal SC which is fed to the control inputs C1 and C2 of the MOSFETs Q1 and Q2, respectively, as explained with respect to FIG. 1.

In an alternative embodiment (not shown in FIGS. 1 and 2), one or more delay modules may be arranged behind the outputs of the comparator 2. For example a first delay module may be arranged to receive the first signal S1 and a second delay module may be arranged to receive the second signal S2. The delay module may for example be implemented as an RC circuit with appropriate resistance and capacitance values to achieve a desired time constant, e.g. 2 µs. Thus, the fault signals S1 and S2 need to be present for at least 2 µs before the shutdown signal SC is generated to shut down the semiconductor switches Q1 and Q2 via the control inputs C1 and C2, respectively. The time constant of 2 µs is mentioned as an example and the specific time constant to be chosen would depend on the specific implementation. In any case, as the danger of overheating and fire is thermal and, thus, slow by nature, a properly chosen time constant may avoid false alerts while still ensuring a proper operation of the circuit protection according to the invention.

Figure 3:
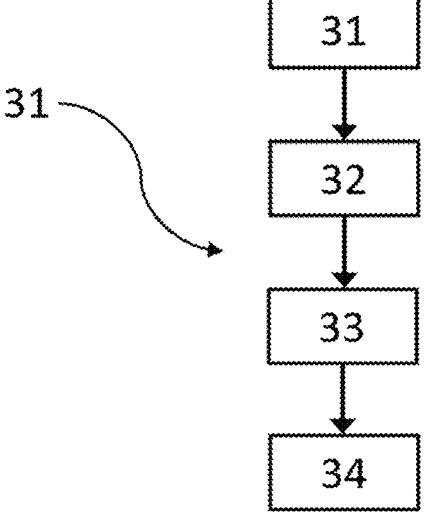
FIG. 3 illustrates an example embodiment of a method of controlling electrical current according to the invention.

FIG. 3 illustrates an example embodiment of a method of controlling electrical current according to the invention. In a first step 31 a first voltage drop across a first semiconductor switch is measured. This may be the voltage drop u1 across the first semiconductor switch Q1 as outlined with respect to FIGS. 1 and 2. In a step 32, a second voltage drop across a second semiconductor switch being connected in series with the first semiconductor switch is measured. This may be the voltage drop u2 across the second semiconductor switch Q2 as outlined with respect to FIGS. 1 and 2. In a step 33 the first voltage drop is compared to the second voltage drop. This may be performed by the comparator 2 as outlined with respect to FIGS. 1 and 2. In a step 34 at least one of the first semiconductor switch and the second semiconductor switch is switched off if the first voltage drop exceeds the second voltage drop by a first predetermined threshold or if the second voltage drop exceeds the first voltage drop by a second predetermined threshold. This may be caused by the first or second signal, S1 or S2, respectively, as outlined with respect to FIGS. 1 and 2. Thus, the method according to the invention may be implemented by using an example power switching circuit 1 as described with respect to FIGS. 1 and 2.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. An electrical power switching circuit comprising:
a first semiconductor switch having a first control input;
a second semiconductor switch having a second control input, wherein the first semiconductor switch and the second semiconductor switch are connected in series;
a comparator configured to:
compare a first voltage to a second voltage,
output a first electrical signal in response to the first voltage exceeding the second voltage by a first predetermined threshold, and
output a second electrical signal in response to the second voltage exceeding the first voltage by a second predetermined threshold,
wherein the first voltage corresponds to a voltage drop across the first semiconductor switch and wherein the second voltage corresponds to a voltage drop across the second semiconductor switch; and
a combiner configured to combine the first signal and the second signal and to feed a combined signal to the first and second control inputs, wherein the combined signal is configured to switch off the first semiconductor switch and the second semiconductor switch.

2. The electrical power switching circuit of claim 1 wherein the first predetermined threshold and the second predetermined threshold are equal.

3. The electrical power switching circuit of claim 1 further comprising:
a first differential amplifier configured to measure the voltage drop across the first semiconductor switch and to output an amplified voltage to the comparator; and
a second differential amplifier configured to measure the voltage drop across the second semiconductor switch and to output an amplified voltage to the comparator.

4. The electrical power switching circuit of claim 1 further comprising a latch configured to latch the first signal and the second signal.

5. The electrical power switching circuit of claim 4 wherein the latch is configured to provide the latched first signal and the latched second signal to the combiner.

6. The electrical power switching circuit of claim 1 wherein the combiner is a logical gate.

7. The electrical power switching circuit of claim 1 further comprising a delay module configured to delay the first signal and the second signal.

8. The electrical power switching circuit of claim 7 wherein the delay module includes a resistor-capacitor circuit.

9. The electrical power switching circuit of claim 1 wherein:
the first signal indicates a failure of the first semiconductor switch, and the second signal indicates a failure of the second semi-conductor switch.

10. The electrical power switching circuit of claim 9 further comprising at least one output indicating a failure of at least one of the first semiconductor switch or second semiconductor switch for diagnostic purpose.

11. The electrical power switching circuit of claim 1 further comprising a common input configured to simultaneously switch the first semiconductor switch and the second semiconductor switch.

12. A system comprising:

the electrical power switching circuit of claim 1; and a load connected to the electrical power switching circuit such that the electrical power switching circuit is configured to control operation of the load.

13. A method of controlling electrical current, the method comprising:

measuring a first voltage drop across a first semiconductor switch;

measuring a second voltage drop across a second semiconductor switch being connected in series with the first semiconductor switch;

comparing the first voltage drop to the second voltage drop;

in response to the first voltage drop exceeding the second voltage drop by a first predetermined threshold, switching off of the first semiconductor switch or the and the second semiconductor switch; and in response to the second voltage drop exceeding the first voltage drop by a second predetermined threshold, switching off the first semiconductor switch and the second semiconductor switch.

* * * * *